(12) United States Patent
Luo et al.

(10) Patent No.: US 11,411,026 B2
(45) Date of Patent: Aug. 9, 2022

(54) METHOD FOR MANUFACTURING ARRAY SUBSTRATE AND ARRAY SUBSTRATE

(71) Applicant: SHENZHEN CHINA STAR OPTOELECTRONICS SEMICONDUCTOR DISPLAY TECHNOLOGY CO., LTD., Shenzhen (CN)

(72) Inventors: Chuanbao Luo, Shenzhen (CN); Dai Tian, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/621,996

(22) PCT Filed: Nov. 15, 2019

(86) PCT No.: PCT/CN2019/118661
§ 371 (c)(1),
(2) Date: Dec. 12, 2019

(87) PCT Pub. No.: WO2021/082089
PCT Pub. Date: May 6, 2021

(65) Prior Publication Data
US 2021/0134843 A1 May 6, 2021

(30) Foreign Application Priority Data

Oct. 31, 2019 (CN) .......................... 201911048962.3

(51) Int. Cl.
*H01L 27/12* (2006.01)
*H01L 23/532* (2006.01)
(Continued)

(52) U.S. Cl.
CPC ...... *H01L 27/127* (2013.01); *H01L 21/32134* (2013.01); *H01L 23/532* (2013.01);
(Continued)

(58) Field of Classification Search
CPC ............. H01L 29/7869; H01L 27/1222; H01L 27/1259; H01L 29/45; H01L 27/1288;
(Continued)

(56) References Cited

U.S. PATENT DOCUMENTS

2006/0283833 A1* 12/2006 Lee .................... G02F 1/136286
349/139
2008/0079006 A1* 4/2008 Park .................... H01L 29/4908
252/79.3
(Continued)

FOREIGN PATENT DOCUMENTS

CN 101388413 A 3/2009
CN 101770982 A 7/2010
(Continued)

*Primary Examiner* — Aaron J Gray
(74) *Attorney, Agent, or Firm* — Osha Bergman Watanabe & Burton LLP

(57) ABSTRACT

A method for manufacturing an array substrate and a array substrate are provided. The method includes steps of sequentially forming a first metal structure layer, an insulating layer, a semiconductor layer, and a second metal structure layer on the substrate. The first metal thin film layer and the second metal thin film layer are etched with an electrolyte solution to form a patterned second metal structure layer. The patterned second metal structure layer includes a source and a drain.

12 Claims, 8 Drawing Sheets

(51) Int. Cl.
   *H01L 29/45* (2006.01)
   *H01L 29/786* (2006.01)
   *H01L 21/3213* (2006.01)

(52) U.S. Cl.
   CPC ........ *H01L 27/124* (2013.01); *H01L 27/1222* (2013.01); *H01L 27/1259* (2013.01); *H01L 27/1288* (2013.01); *H01L 29/45* (2013.01); *H01L 29/7869* (2013.01)

(58) Field of Classification Search
   CPC ............. H01L 21/32134; H01L 29/786; H01L 27/1214; H01L 27/124; H01L 27/127; H01L 23/532
   See application file for complete search history.

(56) References Cited

U.S. PATENT DOCUMENTS

| | | | |
|---|---|---|---|
| 2011/0073867 A1* | 3/2011 | Xie | H01L 27/124 438/34 |
| 2012/0012836 A1* | 1/2012 | Sasagawa | H01L 27/1214 257/E29.296 |
| 2015/0044789 A1 | 2/2015 | Yamada et al. | |
| 2015/0115264 A1* | 4/2015 | Kato | H01L 29/458 257/43 |
| 2017/0033192 A1* | 2/2017 | Wang | H01L 29/22 |
| 2018/0212059 A1* | 7/2018 | Ning | H01L 21/47635 |

FOREIGN PATENT DOCUMENTS

| | | |
|---|---|---|
| CN | 103608856 A | 2/2014 |
| CN | 104716198 A | 6/2015 |
| JP | H11354810 A | 12/1999 |

* cited by examiner

METHOD FOR MANUFACTURING ARRAY SUBSTRATE AND ARRAY SUBSTRATE

FIELD OF INVENTION

The present disclosure relates to a technical field of displays, and particularly to a method for manufacturing an array substrate and an array substrate.

BACKGROUND OF DISCLOSURE

At present, active matrix liquid crystal displays and active matrix organic electroluminescent diodes with significant advantages, such as large sizes, high frame rate processing, and high transmittance in visible light ranges, have broad application prospects in the display field. With the increase of sizes of display panels, in order to further reduce the capacitance-resistance time delay effect of metal traces, a technical route of manufacturing metal traces with copper as the main material has been employed in metal wiring. Moreover, in order to increase resolutions of the display panels, under the premise of increasing aperture ratios, sizes of thin film transistors are minimized as much as possible.

Technical Problem

When a metal film layer is patterned by an etching process, a channel of the thin film transistor (which is the distance between a source and a drain) is generally widened due to a fast corrosion rate of copper in the etching solution. Therefore, the application requirements of the narrow channels of the thin film transistors cannot be met.

SUMMARY OF INVENTION

Technical Solutions

The present disclosure provides a method for manufacturing an array substrate and an array substrate for reducing a fast corrosion rate of copper in an etching solution, thereby meeting the application requirements of narrow channels of thin film transistors.

The present disclosure provides a method for manufacturing an array substrate, including steps of:
providing a substrate;
forming a patterned first metal structure layer on the substrate;
forming an insulating layer on the substrate;
forming a semiconductor layer on the substrate;
forming a second metal structure layer on the semiconductor layer, wherein the second metal structure layer includes a first metal thin film layer and a second metal thin film layer sequentially formed; and
etching the second metal structure layer with an electrolyte solution to form a patterned second metal structure layer, wherein the patterned second metal structure layer includes a source and a drain, the first metal thin film layer, the second metal thin film layer, and the electrolyte solution, form a primary cell, the second metal thin film layer is an anode, the electrolyte solution is a hydrogen peroxide-based etching solution, and material of the second metal thin film layer is one or a combination of molybdenum, titanium and nickel.

In accordance with the method for manufacturing the array substrate in the present disclosure, the step of forming the second metal structure layer on the semiconductor layer comprises a step of:

sequentially forming a third metal thin film layer, the first metal thin film layer, and the second metal thin film layer on the semiconductor layer, by using a sputtering process, to form the second metal structure layer;
wherein in the step of etching the second metal structure layer with the electrolyte solution to form the patterned second metal structure layer, the first metal thin film layer, the third metal thin film layer, and the electrolyte solution form a primary cell, and the third metal thin film layer is an anode.

In accordance with the method for manufacturing the array substrate in the present disclosure, wherein a thickness of the second metal thin film layer is smaller than a thickness of the third metal thin film layer.

In accordance with the method for manufacturing the array substrate in the present disclosure, etching the second metal structure layer with the electrolyte solution to form the patterned second metal structure layer comprises steps of:
forming a photoresist layer on the second metal structure layer;
patterning the photoresist layer with a photomask to at least form a first portion corresponding to a source deployment region and a drain deployment region of the second metal structure layer, and a second portion corresponding to a channel deployment region between the source deployment region and the drain deployment region, wherein a thickness of the first portion is greater than a thickness of the second portion;
etching the second metal structure layer with the electrolyte solution, by using the patterned photoresist layer as a mask, to form a preliminary patterned second metal structure layer;
ashing the patterned photoresist layer, thinning the first portion, removing the second portion, and exposing the channel deployment region of the second metal structure layer;
etching the preliminary patterned second metal structure layer with the electrolyte solution to at least form the source, the drain, and the channel between the source and the drain;
wherein in the step of etching the preliminary patterned second metal structure layer with the electrolyte solution, the first metal thin film layer, the second metal thin film layer, and the electrolyte solution form a primary cell, and the second metal thin film layer is an anode; and
removing the photoresist layer.

In accordance with the method for manufacturing the array substrate in the present disclosure, the step of forming the patterned first metal structure layer on the substrate comprises steps:
sequentially forming a fourth metal thin film layer, a fifth metal thin film layer, and a sixth metal thin film layer on the substrate to form the first metal structure layer; and
etching the first metal structure layer with the electrolyte solution to form the patterned first metal structure layer, wherein the fourth metal thin film layer, the fifth metal thin film layer, and the electrolyte solution form a primary cell, the fourth metal thin film layer is an anode, the fifth metal thin film layer, the sixth metal thin film layer, and the electrolyte solution form a primary cell, and the sixth metal thin film layer is an anode.

In accordance with the method for manufacturing the array substrate in the present disclosure, material of the first metal thin film layer is copper.

The present disclosure further provides a method for manufacturing an array substrate, including steps of:
providing a substrate;

forming a patterned first metal structure layer on the substrate;

forming an insulating layer on the substrate;

forming a semiconductor layer on the substrate;

forming a second metal structure layer on the semiconductor layer, wherein the second metal structure layer includes a first metal thin film layer and a second metal thin film layer sequentially formed; and etching the second metal structure layer with an electrolyte solution to form a patterned second metal structure layer, wherein the patterned second metal structure layer includes a source and a drain; the first metal thin film layer, the second metal thin film layer, and the electrolyte solution form a primary cell, and the second metal thin film layer is an anode.

In accordance with the method for manufacturing the array substrate in the present disclosure, the step of forming the second metal structure layer on the semiconductor layer comprises a step of:

sequentially forming a third metal thin film layer, the first metal thin film layer, and the second metal thin film layer on the semiconductor layer, by using a sputtering process, to form the second metal structure layer;

wherein in the step of etching the second metal structure layer with the electrolyte solution to form the patterned second metal structure layer, the first metal thin film layer, the third metal thin film layer, and the electrolyte solution form a primary cell, and the third metal thin film layer is an anode.

In accordance with the method for manufacturing the array substrate in the present disclosure, a thickness of the second metal thin film layer is smaller than a thickness of the third metal thin film layer.

In accordance with the method for manufacturing the array substrate in the present disclosure, etching the second metal structure layer with the electrolyte solution to form the patterned second metal structure layer comprises steps of:

forming a photoresist layer on the second metal structure layer;

patterning the photoresist layer with a photomask to at least form a first portion corresponding to a source deployment region and a drain deployment region of the second metal structure layer, and a second portion corresponding to a channel deployment region between the source deployment region and the drain deployment region, wherein a thickness of the first portion is greater than a thickness of the second portion;

etching the second metal structure layer with the electrolyte solution, by using the patterned photoresist layer as a mask, to form a preliminary patterned second metal structure layer;

ashing the patterned photoresist layer, thinning the first portion, removing the second portion, and exposing the channel deployment region of the second metal structure layer;

etching the preliminary patterned second metal structure layer with the electrolyte solution to at least form the source, the drain, and the channel between the source and the drain;

wherein in the step of etching the preliminary patterned second metal structure layer with the electrolyte solution, the first metal thin film layer, the second metal thin film layer, and the electrolyte solution form a primary cell, and the second metal thin film layer is an anode; and removing the photoresist layer.

In accordance with the method for manufacturing the array substrate in the present disclosure, after the step of etching the second metal structure layer with the electrolyte solution, further comprising a step of etching the semiconductor layer with the electrolyte solution to form a patterned semiconductor layer.

In accordance with the method for manufacturing the array substrate in the present disclosure, the step of forming the patterned first metal structure layer on the substrate comprises steps:

sequentially forming a fourth metal thin film layer, a fifth metal thin film layer, and a sixth metal thin film layer on the substrate to form the first metal structure layer; and etching the first metal structure layer with the electrolyte solution to form the patterned first metal structure layer, wherein the fourth metal thin film layer, the fifth metal thin film layer, and the electrolyte solution form a primary cell, the fourth metal thin film layer is an anode, the fifth metal thin film layer, the sixth metal thin film layer, and the electrolyte solution form a primary cell, and the sixth metal thin film layer is an anode.

In accordance with the method for manufacturing the array substrate in the present disclosure, after the step of forming the patterned second metal structure layer, further comprising steps of:

forming a patterned protective layer on the substrate, wherein the protective layer covers the second metal structure layer; and forming a patterned pixel electrode layer on the protective layer, wherein the pixel electrode layer is electrically connected to the drain.

In accordance with the method for manufacturing the array substrate in the present disclosure, the electrolyte solution is a hydrogen peroxide-based etching solution.

In accordance with the method for manufacturing the array substrate in the present disclosure, material of the first metal thin film layer is copper.

In accordance with the method for manufacturing the array substrate in the present disclosure, material of the second metal thin film layer is one or a combination of molybdenum, titanium and nickel.

The present disclosure provides an array substrate including:

a substrate;

a first metal structure layer disposed on the substrate;

an insulating layer disposed on the substrate and covering the first metal structure layer;

a semiconductor layer disposed on the insulating layer; and a second metal structure layer disposed on the semiconductor layer; wherein the second metal structure layer includes a first metal thin film layer, a second metal, thin film layer, and a third metal thin film layer, which are sequentially disposed, and a thickness of the third metal thin film layer is smaller than a thickness of the first metal thin film layer.

Beneficial Effect:

Compared with the conventional method for manufacturing an array substrate, in the method for manufacturing the array substrate in the present disclosure, the second metal thin film layer is formed on a side of the first metal thin film layer away from the semiconductor layer, and in the etching process which is performed on the second metal structural layer with the electrolyte solution, the first metal thin film layer, the second metal thin film layer, and the electrolyte solution form the primary cell. The second metal thin film layer is used as the anode of the primary cell, thereby reducing the corrosion rate of the first metal thin film layer, thereby meeting the application requirements of the narrow channel of the thin film transistor.

BRIEF DESCRIPTION OF DRAWINGS

In order to more clearly illustrate the embodiments of the present disclosure or the technical solutions in prior arts, the following briefly introduces the accompanying drawings used in the embodiments. Obviously, the drawings in the following description merely show some of the embodiments of the present disclosure. As regards one of ordinary skill in the art, other drawings can be obtained in accordance with these accompanying drawings without making inventiveness efforts.

DETAILED DESCRIPTION OF PREFERRED EMBODIMENTS

The technical solutions in the embodiments of the present disclosure are clearly and completely described as follows with reference to the accompanying drawings in the embodiments. It is apparent that the described embodiments are only a part of the embodiments of the present disclosure, and not all of the embodiments. All other embodiments obtained by a person skilled in the art based on the embodiments of the present disclosure without inventive efforts are within the scope of the present disclosure.

It should be noted that the array substrate prepared by the method for manufacturing an array substrate of the present disclosure includes a thin film transistor, wherein the thin film transistor may be a bottom gate type or a top gate type. The method for manufacturing the array substrate in this embodiment is described by taking a bottom gate thin film transistor as an example, but is not limited thereto.

Figure 1:
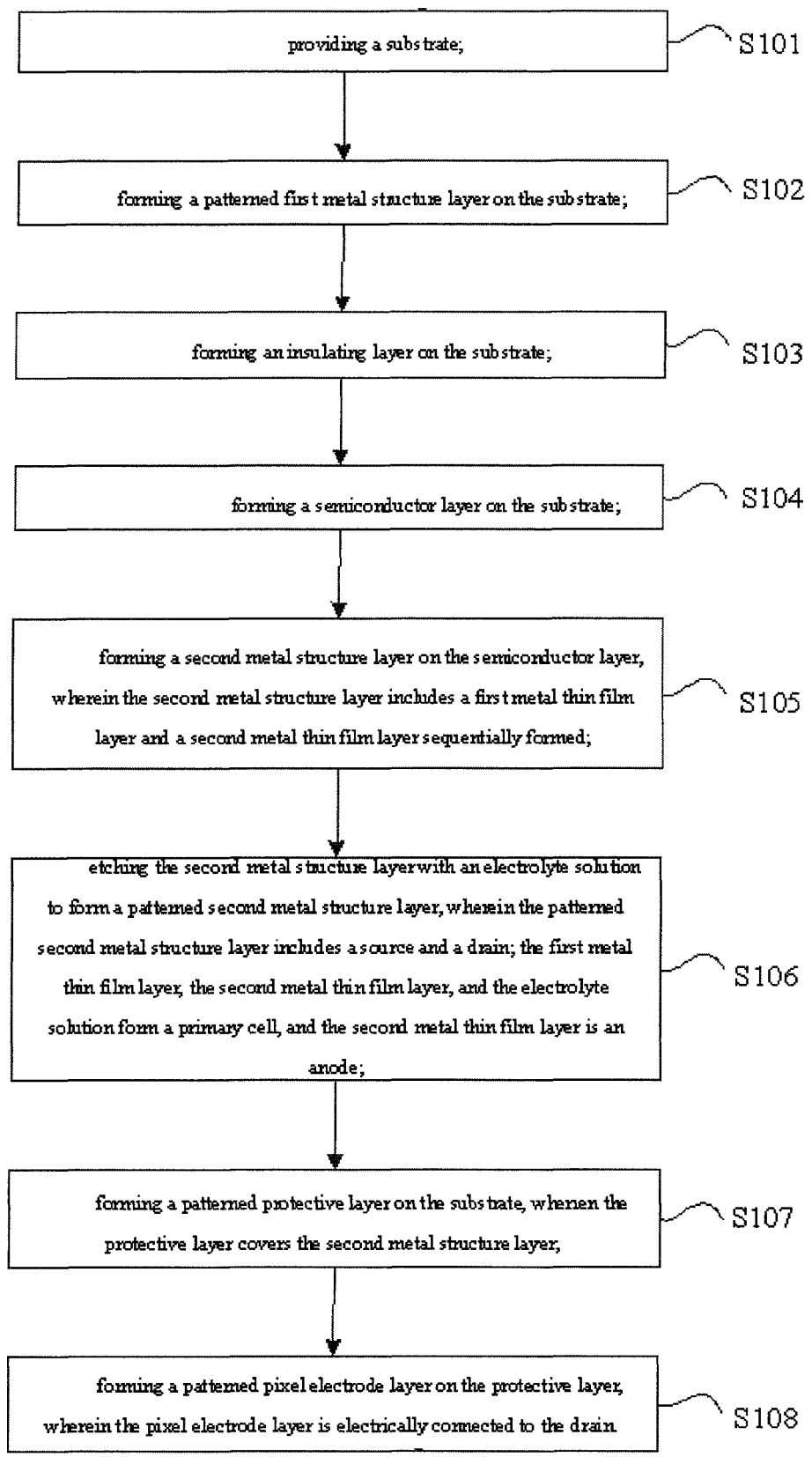
FIG. 1 is a schematic flowchart of a method for manufacturing an array substrate provided by an embodiment of the present disclosure.

Refer to FIG. 1 and FIG. 2A-FIG. 2H. FIG. 1 is a schematic flowchart of a method for manufacturing an array substrate provided by an embodiment of the present disclosure. FIG. 2A-FIG. 2H are schematic structural diagrams sequentially obtained from step S101 to step S108 in the method for manufacturing the array substrate provided by an embodiment of the present disclosure.

The embodiment of the present disclosure provides a method for preparing the array substrate 100, including the following steps:

Step S101: providing a substrate 11.

Step S102: forming a patterned first metal structure layer 12 on the substrate 11, wherein the first metal structure layer 12 includes a forth metal thin film 121, a fifth metal thin film layer 122 and a sixth metal thin film layer 123 sequentially formed.

Step S103: forming an insulating layer 13 on the substrate 11.

Step S104: forming a semiconductor layer 14 on the substrate 11.

Step S105: forming a second metal structure layer 15 on the semiconductor layer 14, wherein the second metal structure layer 15 includes a third metal thin film 153, a first metal thin film layer 151 and a second metal thin film layer 152 sequentially formed.

Step S106: etching the second metal structure layer 15 and the semiconductor layer 14 with an electrolyte solution to form a patterned second metal structure layer 15 and a patterned semiconductor layer 14, wherein the patterned second metal structure layer 15 includes a source 15a and a drain 15b, the first metal thin film layer 151, the second, metal thin film layer 152, and the electrolyte solution form a primary cell, and the second metal thin film layer 152 is an anode.

Step S107: forming a patterned protective layer 16 on the substrate 11, wherein the protective layer 16 covers the second metal structure layer 15.

Step S108: forming a patterned pixel electrode layer 17 on the protective layer 16, wherein the pixel electrode layer 17 is electrically connected to the drain 15b.

Therefore, in the method for manufacturing the array substrate in the present disclosure, the second metal thin film layer 152 is formed on a side of the first metal thin film layer 151 away from the semiconductor layer 14, and in the etching process which is performed on the second metal structural layer 15 with the electrolyte solution, the first metal thin film layer 151, the second metal thin film layer 152, and the electrolyte solution form the primary cell. The second metal thin film layer 152 is used as the anode of the primary cell, thereby reducing a corrosion rate of the first metal thin film layer 151, thereby meeting the application requirements of the narrow channel of the thin film transistor.

The method for manufacturing the array substrate 100 in accordance with the embodiment of the present disclosure is described in detail below.

Step S101: providing a substrate 11.

Figure 2A:
FIG. 2A-FIG. 2H are schematic structural diagrams sequentially obtained from step S101 to step S108 in a method for manufacturing an array substrate provided by an embodiment of the present disclosure.

Refer to FIG. 2A. The substrate 11 may be a rigid substrate, such as a glass substrate. Then, the process proceeds to step S102.

Figure 2B:
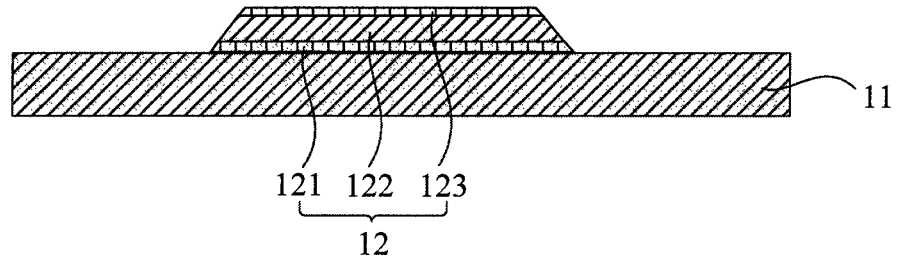

Step S102: forming a patterned first metal structure layer 12 on the substrate 11, wherein the first metal structure layer 12 includes a forth metal thin film 121, a fifth metal thin film layer 122 and a sixth metal thin film layer 123 sequentially formed, as shown in FIG. 2B.

Specifically, Step S102 includes the following steps:

Step S1021: forming a buffer layer on the substrate 11 (not shown).

Step S1022: sequentially forming a fourth metal thin film layer 121, a fifth metal thin film layer 122, and a sixth metal thin film layer 123 on the buffer layer to form the first metal structure layer 12.

Step S1023: performing a patterning process on the first metal structure layer 12 to form at least a gate.

Step S1021: forming a buffer layer (not shown) on the substrate 11.

Step S1022: sequentially forming a fourth metal thin film layer 121, a fifth metal thin film layer 122, and a sixth metal thin film layer 123 on the buffer layer to form a first metal structure layer 12.

Step S1023: performing a patterning process on the first metal structure layer 12 to form at least a gate.

In Step S1021, the substrate 11 is first washed with a cleaning solution, such as pure water or hot sulfuric acid, and then inorganic material is deposited on the substrate 11 by a chemical vapor deposition method to form the buffer layer.

In Step S1022, the fourth metal thin film layer 121, the fifth metal thin film layer 122, and the sixth metal thin film layer 123 are sequentially formed on the buffer layer by using a physical vapor deposition method to form the first metal structure layer 12.

In Step S1023, a patterned first metal structure layer 12 is formed by a wet etching process to form at least a gate.

Specifically, the first metal structure layer 12 is etched with an electrolyte solution to form the patterned first metal structure layer 12. The patterned first metal structure layer 12 includes a gate and other metal wires (not shown).

Optionally, the electrolyte solution is a hydrogen peroxide-based etching solution or an acidic etching solution. In some embodiments, the electrolyte solution may also be an ammonium salt type etching solution. In addition, the type of the electrolyte solution may also be selected according to a material of the etched film layer. Details are not redundantly described herein.

Optionally, a material of the fifth metal thin film layer 122 is copper, gold, silver, or aluminum. Materials of the fourth metal thin film layer 121 and the sixth metal thin film layer 123 are both one or a combination of molybdenum, titanium, and nickel.

Furthermore, in the etching process which is performed on the first metal structure layer 12 with the electrolyte solution, the fourth metal thin film layer 121, the fifth metal thin film layer 122, and the electrolyte solution form a primary cell, and the fourth metal thin film layer 121 is an anode. The fifth metal thin film layer 122, the sixth metal thin film layer 123, and the electrolyte solution form a primary cell, and the sixth metal thin film layer 123 is an anode.

The material of the fifth metal thin film layer 122 being copper, and the materials of the fourth metal thin film layer 121 and the sixth metal thin film layer 123 both being molybdenum/titanium alloy are taken as examples. During the etching process of the first metal structure layer 12, copper, an electrolyte solution, and a molybdenum/titanium alloy constitute two sets of primary cells. In this primary cell, the chemical electrode potential of the molybdenum/titanium alloy is higher than the chemical electrode potential of copper, so that an oxidation reaction occurs to the molybdenum/titanium alloy serving as an anode, and the copper serving as a cathode is protected, thereby reducing the chemical corrosion rate of copper.

Moreover, when the material of the fifth metal thin film layer 122 is copper, since the adhesion between copper and the inorganic film layer is poor, the fifth metal thin film layer 122 is liable, to fall off in the subsequent thermal processes. In the above method, by forming the fourth metal thin film layer 121 on a side of the fifth metal thin film layer 122 close to the substrate, the adhesion between the fifth metal thin film layer 122 and the inorganic film layer, such as the buffer layer, can be enhanced.

In addition, in the above method, the sixth metal thin film layer 123 is formed on a side of the fifth metal thin film layer 122 close to the semiconductor layer 14, and then in the etching process performed on the first metal structure layer 12 with the electrolyte solution, the fifth metal thin film layer 122, the sixth metal thin film layer 123, and the electrolyte solution form a primary cell. A reduction reaction occurs to the fifth metal thin film layer 122 serving as a cathode of the primary cell, thereby reducing an amount of metal ions in the fifth metal thin film layer 122, reducing the probability that the metal ions diffuse into the insulating layer 13, ensuring the conductivity of the semiconductor layer 14, and improving the performance of the thin film transistor.

It should be noted that in some embodiments, the fourth metal thin film layer 121 and the fifth metal thin film layer 122 may only be sequentially formed on the buffer layer to form the first metal structure layer 12. These embodiments should not be considered as a limitation of the present disclosure. Then, the process proceeds to step S103.

Step S103: forming an insulating layer 13 on the substrate 11.

Figure 2C:
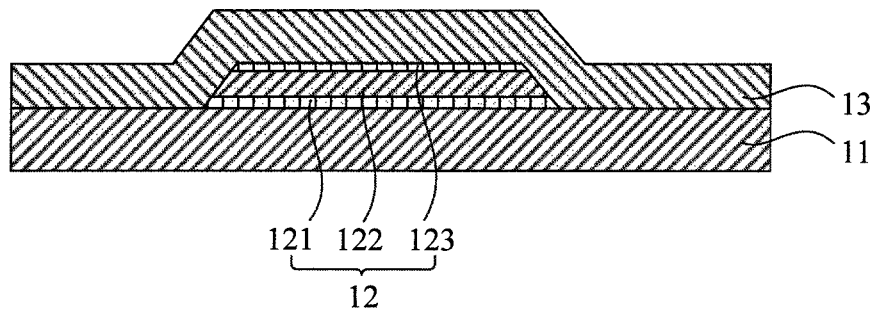

Refer to FIG. 2C. Specifically, an inorganic material is deposited on the buffer layer by a chemical vapor deposition method to form the insulating layer 13. The insulating layer 13 covers the first metal structure layer 12. Then, the process proceeds to step S104.

Step S104: a semiconductor layer 14 is formed on the substrate 11.

Figure 2D:
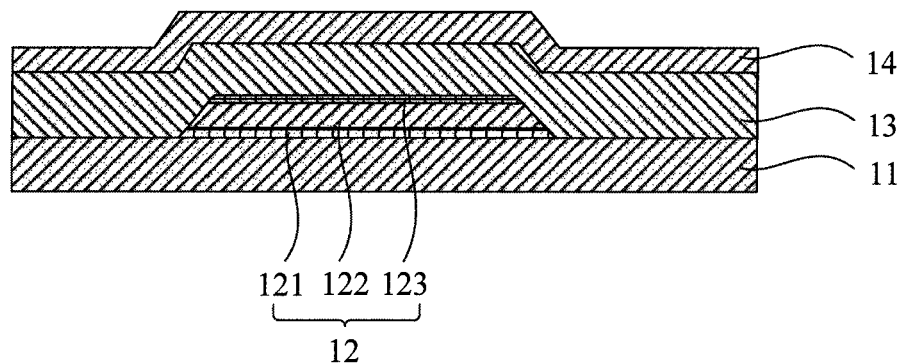

Refer to FIG. 2D. Specifically, the semiconductor layer 14 is deposited on the insulating layer 13 by a chemical vapor deposition method. Optionally, the material of the semiconductor layer 14 is indium gallium zinc oxide. Afterward, the deposited insulating layer 13 and the semiconductor layer 14 are subjected to a high-temperature annealing process. Then, the process proceeds to step S105.

Step S105: A second metal structure layer 15 is formed on the semiconductor layer 14. The second metal structure layer 15 includes a third metal thin film layer 153, a first metal thin film layer 151, and a second metal thin film layer 152 sequentially formed.

Figure 2E:
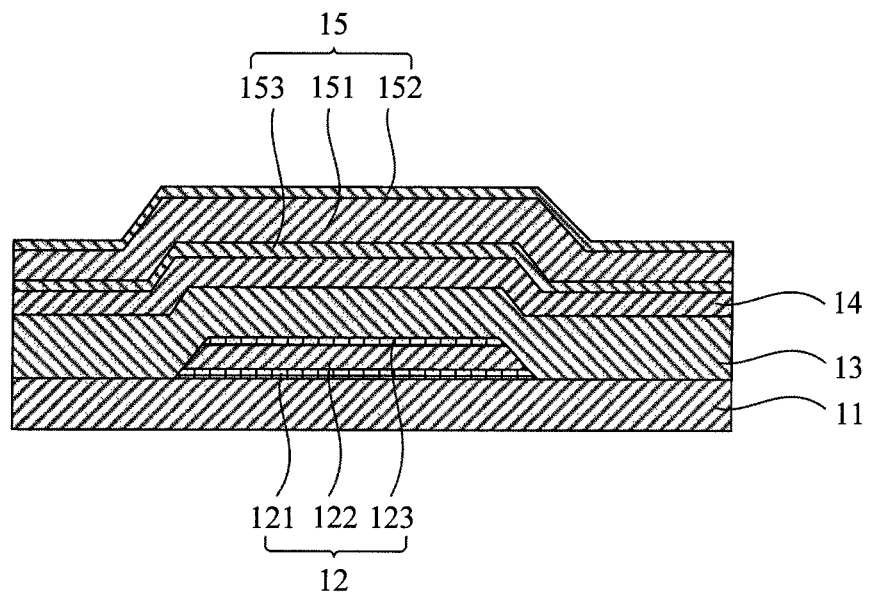
Figure 2F:
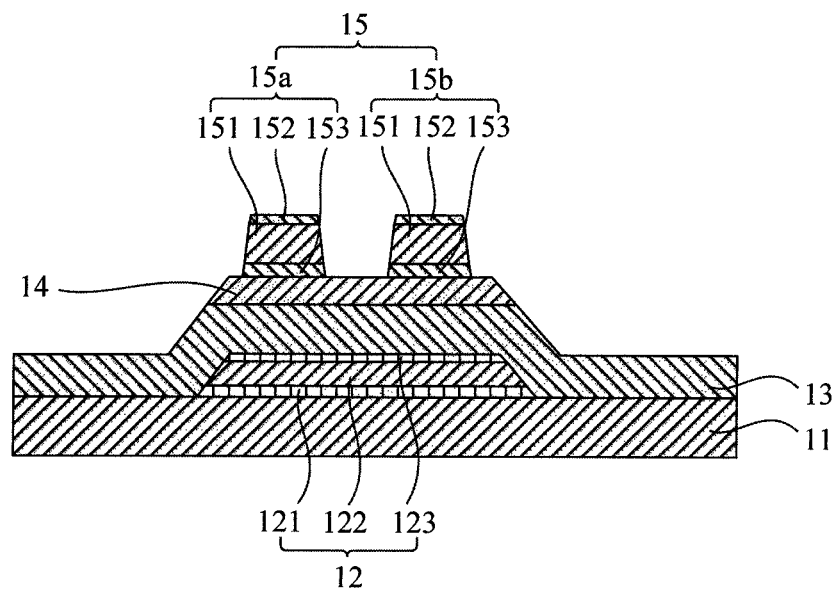

Refer to FIG. 2E. Specifically, the third metal thin film layer 153, the first metal thin film layer 151, and the second metal thin film layer 152 are sequentially formed on the semiconductor layer 14 by a sputtering process to form the second metal structure layer 15.

Optionally, the material of the first metal thin film layer 151 is copper. In addition, in some embodiments, the material of the first metal thin film layer 151 may also be gold, silver, or aluminum. The present disclosure is not limited thereto.

Optionally, the materials of the second metal thin film layer 152 and the third metal thin film layer 153 are both one or a combination of molybdenum, titanium, and nickel.

The three-layer structure composed of the first metal thin film layer 151, the second metal thin film layer 152, and the third metal thin film layer 153 can reduce the resistance of the second metal structure layer 15, and effectively improve the conductivity of the second metal structure layer 15. Thus, the performance of the thin film transistor is improved. Then, the process proceeds to step S106.

Step S106: etching the second metal structure layer 15 and the semiconductor layer 14 with an electrolyte solution to form a patterned second metal structure layer 15 and a patterned semiconductor layer 14, wherein the patterned second metal structure layer 15 includes a source 15a and a drain 15b, the first metal thin film layer 151, the second metal thin film layer 152, and the electrolyte solution form a primary cell, and the second metal thin film layer 152 is an anode.

Figure 3:
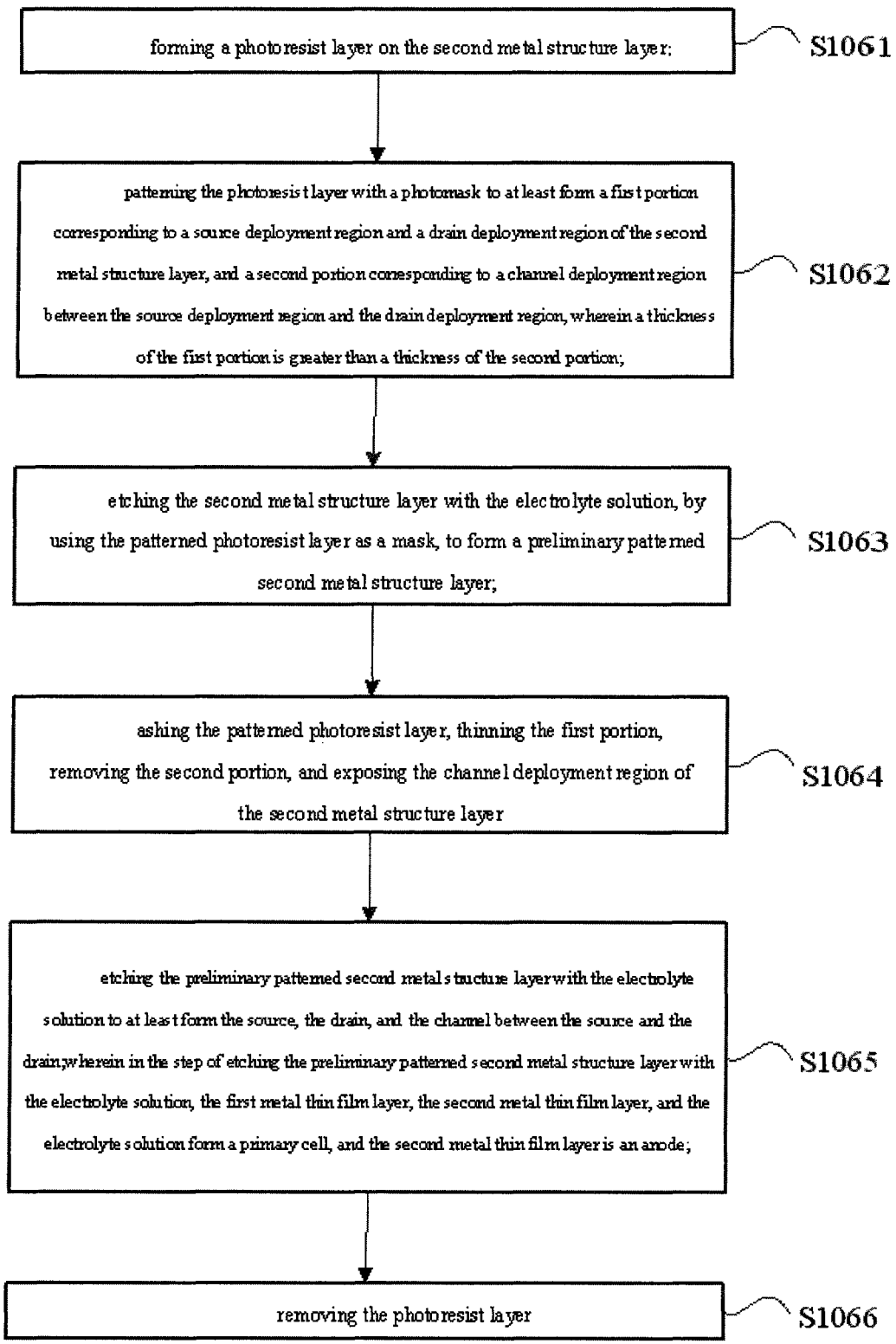
FIG. 3 is a schematic flowchart of step S106 in a method for manufacturing an array substrate in accordance with an embodiment of the present disclosure.

Refer to FIG. 3 and FIG. 4A-FIG. 4D. FIG. 3 is a schematic flow chart of step S106 in the method for manufacturing the array substrate provided by an embodiment of the present disclosure. FIG. 4A-FIG. 4D are schematic structural views sequentially obtained from step S1061 to step S1066 in the method for manufacturing the array substrate provided an embodiment of the present disclosure.

Specifically, Step S106 includes the following steps:

Step S1061: forming a photoresist layer 18 on the second metal structure layer 15.

Step S1062: patterning the photoresist layer 18 with a photomask to at least form a first portion 181 corresponding to a source deployment region and a drain deployment region of the second metal structure layer 15, and a second portion 182 corresponding to a channel deployment region between the source deployment region and the drain deployment region, wherein a thickness of the first portion 181 is greater than a thickness of the second portion 182.

Step S1063: etching the second metal structure layer 15 and the semiconductor layer 14 with the electrolyte solution, by using the patterned photoresist layer 18 as a mask, to form a patterned semiconductor layer 14 and a preliminary patterned second metal structure layer 15.

Step S1064: ashing the patterned photoresist layer 18, thinning the first portion 181, removing the second portion 182, and exposing the channel deployment region of the second metal structure layer 15.

Step S1065: etching the preliminary patterned second metal structure layer 15 with the electrolyte solution to at least form the source 15a, the drain 15b, and the channel 15c between the source 15a and the drain 15b; wherein in the step of etching the preliminary patterned second metal structure layer 15 with the electrolyte solution, the first metal thin film layer 151, the second metal thin film layer 152, and the electrolyte solution form a primary cell, and the second metal thin film layer 152 is an anode.

Step S1066: removing the photoresist layer.

Figure 4A:
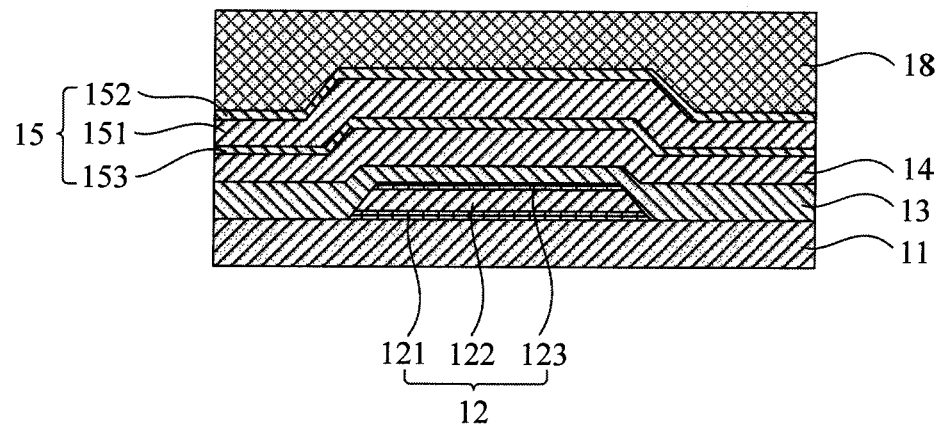
FIG. 4A-FIG. 4D are schematic structural diagrams sequentially obtained from step S1061 to step S1066 in a method for manufacturing an array substrate provided by an embodiment of the present disclosure.

In step S1061, a photoresist is coated on the second metal structure layer 15, by using a coating process, to form a photoresist layer 18, as shown in FIG. 4A.

Figure 4B:
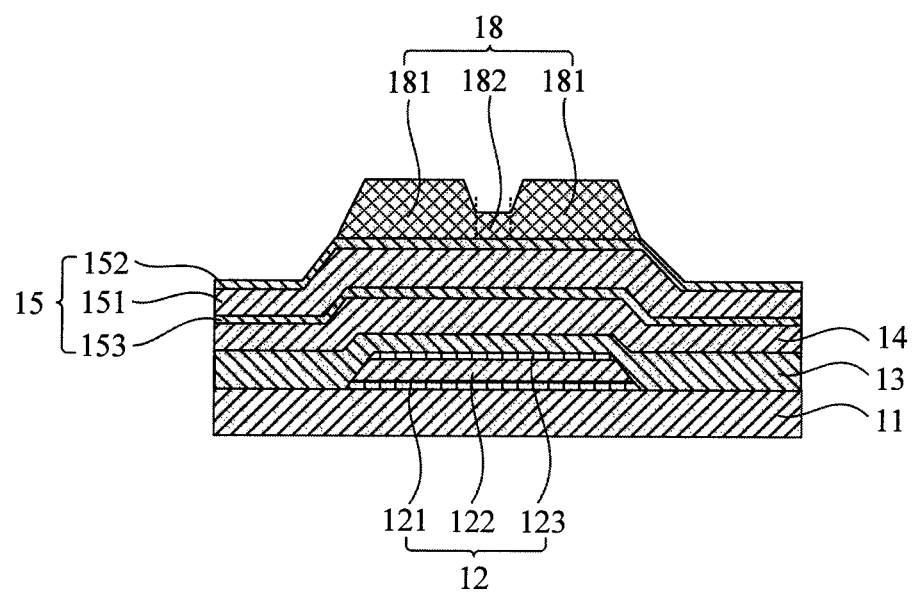

In step S1062, the gray-tone mask or the half-tone mask is used to pattern the photoresist layer 18 to form the first portion 181 and the second portion 182 of the photoresist layer 18, as shown in FIG. 4B.

It can be understood that the patterned photoresist layer 18 may further include other portion rather than the first portion 181 and the second portion 182, for example, corresponding to other metal wires disposed on the same layer as the source 15a and the drain 15b (not shown), and are not redundantly described herein.

It should be noted that the specific thicknesses of the first part 181 and the second part 182 can be determined according to actual conditions, and this embodiment cannot be considered as a limitation of the present disclosure.

In step S1063, after the second metal structure layer 15 is etched, the semiconductor layer 14 is etched with the electrolyte solution to form the patterned semiconductor layer 14.

Figure 4C:
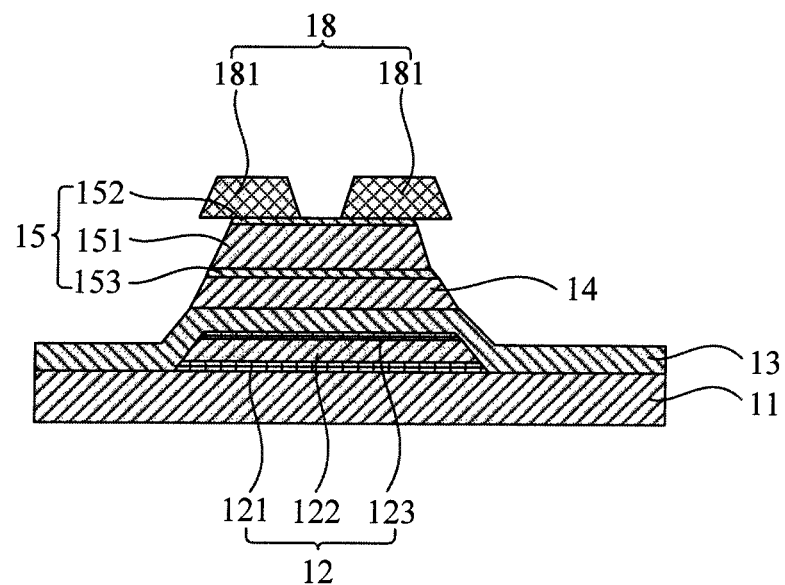

Refer to FIG. 4C. Specifically, the patterned photoresist layer 18 is used as a mask, and the electrolyte solution is used as an etching solution to perform the first patterning process on the second metal structure layer 15 and the semiconductor layer 14, thereby forming the patterned semiconductor layer 14 and the preliminary patterned second metal structure layer 15.

Furthermore, in the etching process performed on the second metal structure layer 15 by using the electrolyte solution, the first metal thin film layer 151, the second metal thin film layer 152, and the electrolyte solution form a primary cell, and the second metal thin film layer 152 is an anode.

Specifically, when the material of the first metal thin film layer 151 is copper, and the material of the second metal thin film layer 153 is molybdenum/titanium alloy, copper, an electrolyte solution, and a molybdenum/titanium alloy together constitute a primary cell. In this primary cell, the chemical electrode potential of the molybdenum/titanium alloy is higher than the chemical electrode potential of copper, so that an oxidation reaction occurs to the molybdenum/titanium alloy serving as an anode, and the copper serving as a cathode is protected, thereby reducing the chemical corrosion rate of copper, and the corrosion degree of copper on a side away from the semiconductor layer 14.

Furthermore, when the second metal structure layer 15 is etched with the electrolyte solution, the first metal thin film layer 151, the third metal thin film layer 153, and the electrolyte solution form a primary cell, and the third metal thin film layer 153 is an anode.

Specifically, when the material of the first metal thin film layer 151 is copper, and the material of the third metal thin film layer 153 is molybdenum/titanium alloy, copper, an electrolyte solution, and a molybdenum/titanium alloy together constitute a primary cell. In this primary cell, the chemical electrode potential of the molybdenum/titanium alloy is higher than the chemical electrode potential of copper, so that an oxidation reaction occurs to the molybdenum/titanium alloy serving as an anode, and the copper serving as a cathode is protected, thereby reducing the chemical corrosion rate of copper, and the corrosion degree of copper on a side close to the semiconductor layer 14.

Thus, in the three-layer film structure composed of the third metal thin film layer 153, the first metal thin film layer 151, and the second metal thin film layer 152, the primary cell structure composed of the first metal thin film layer 151, the electrolyte solution, and the second metal thin film layer 152, and the primary cell structure composed of the third metal thin film layer 153, the electrolyte solution, and the first metal thin film layer 151 respectively are formed. The second metal thin film layer 152 and the third metal thin film layer 153 respectively serve as the anodes of the cells, further inhibiting the chemical corrosion of copper.

In step S1064, the patterned photoresist layer 18 is ashed, the first portion 181 is thinned, and the second portion 182 is removed, to expose the channel deployment region of the second metal structure layer 15.

Figure 4D:
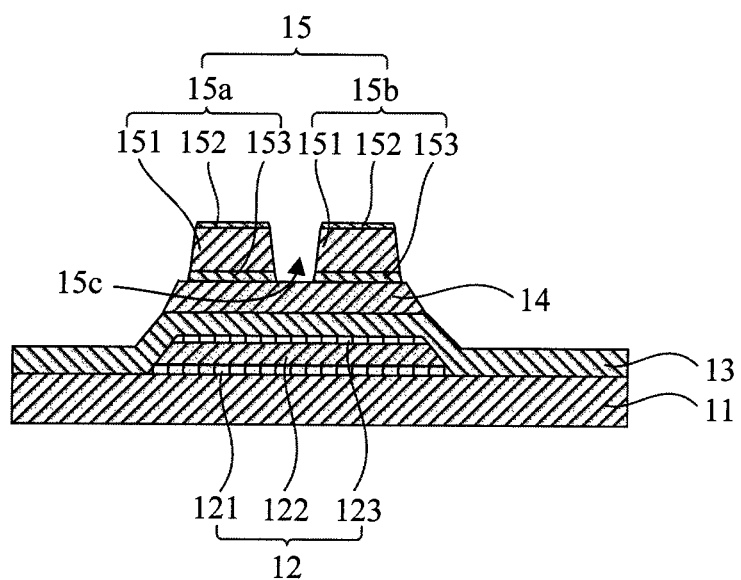

In step S1065, the preliminary patterned second metal structure layer 15 is etched, by using the electrolyte solution as an etching solution, to form a source 15a, a drain 15b, and the channel 15c between the source 15a, and the drain 15b, as shown in FIG. 4D.

It should be noted that after the preliminary patterned second metal structure layer 15 is etched, in addition to the source 15a, the drain 15b, and the channel 15c between the source 15a and the drain 15b, metal wires may be formed (not shown), and are not redundantly described herein.

In the primary cell composed of the first metal thin film layer 151, the electrolyte solution, and the second metal thin film layer 152, the second metal thin film layer 152 serving as an anode is oxidized, so that the corrosion rate of the first metal thin film layer 151 is reduced, and, thereby, the loss of the first metal thin film layer 151 is also reduced. Therefore, in the process of designing the channel 15c between the source 15a and the drain 15b, under the premise of ensuring a conductive performance of the thin film transistor, the size of the channel 15c may be further reduced to meet the application requirements of the narrow channel of the thin film transistor.

Furthermore, in the embodiment of the present disclosure, a thickness of the second metal thin film layer 152 is smaller than a thickness of the third metal thin film layer 153.

Optionally, the thickness of the second metal thin film layer 152 is 50-200 Angstroms. The thickness of the third metal thin film layer 153 is 100-800 Angstroms. In addition, the specific thicknesses of the second metal thin film layer 152 and the third metal thin film layer 153 may also be determined according to actual conditions. The present disclosure is not limited thereto.

It can be understood that the material of the first metal thin film layer 151 being copper, and the material of the second metal thin film layer 152 and the third metal thin film layer 153 being molybdenum/titanium alloy are taken as examples. Since the corrosion rate of copper in the etching solution is much faster than the corrosion rate of molybdenum/titanium alloy, although molybdenum/titanium alloy inhibits the etching of copper, the chemical corrosion of copper still dominates.

In this disclosure, by determining the thickness of the second metal thin film layer 152 to be smaller than the thickness of the third metal thin film layer 153, the corrosion rate of the second metal thin film layer 152 is lower than the corrosion rate of the third metal thin film layer 153, thereby reducing the probability that the first metal thin film layer 151 is recessed inward, further reducing the risk of disconnection of the second metal structure layer 15 used as metal wires, and improving the conductive performance of the thin film transistor.

In Step S1066, the photoresist layer 18 is removed. Then, the process proceeds to step S107.

Step S107: forming a patterned protective layer 16 on the substrate 11, wherein the protective layer 16 covers the second metal structure layer 15.

Figure 2G:
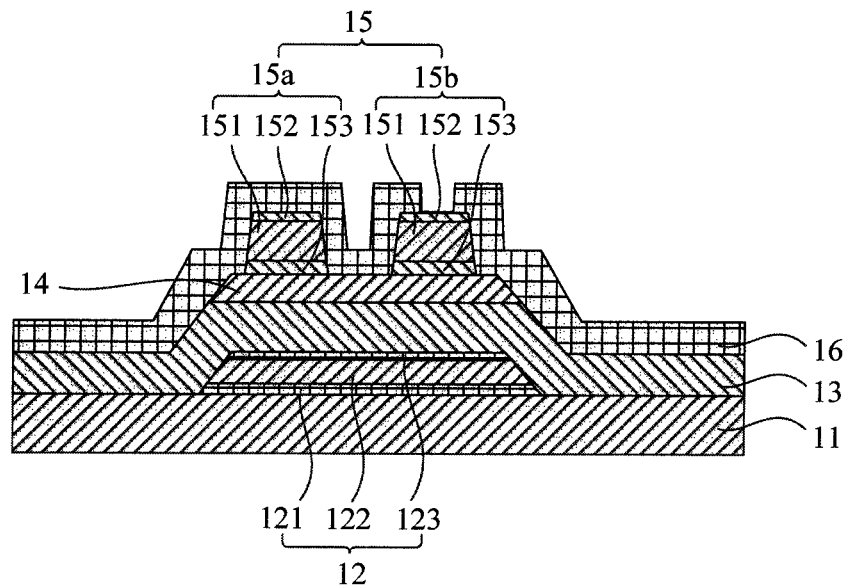

Refer to FIG. 2G. Specifically, an inorganic material is deposited on the insulating layer 13 by a chemical vapor deposition method to form a protective layer 16. The protective layer 16 covers the semiconductor layer 14, the source 15 a and the drain 15 b.

Afterward, a part of the protection layer 16 located on the drain 15 b is patterned by a photolithography process, a via hole (not shown) corresponding to the drain 15 b is formed, and the drain hole 15b is exposed. Then, the process proceeds to step S108.

Step S108: forming a patterned pixel electrode layer 17 on the protective layer 16, wherein the pixel electrode layer 17 is electrically connected to the drain 15b.

Figure 2H:
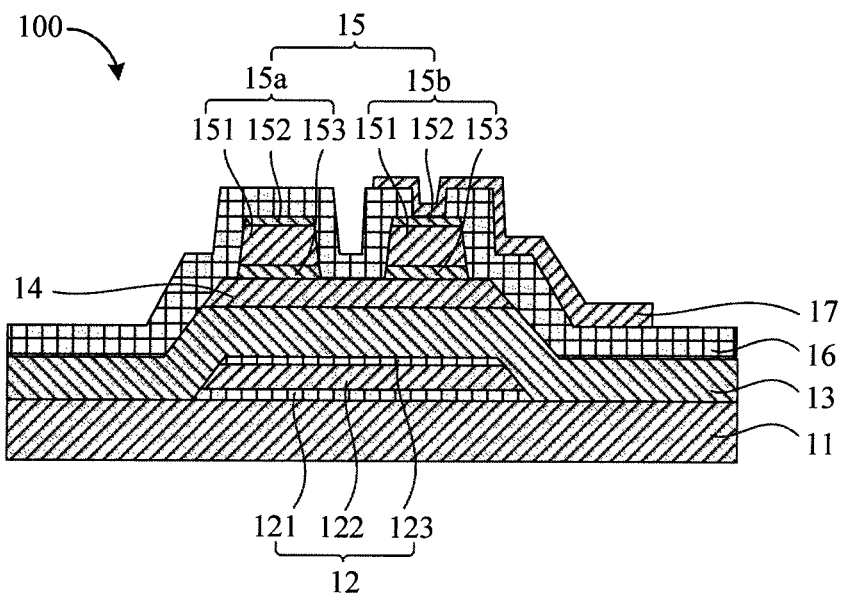

Refer to FIG. 2H. Specifically, a conductive material is deposited on a surface of the protective layer 16 by a vapor deposition method to form the pixel electrode layer 17. Afterward, a patterned pixel electrode layer 17 is formed by a photolithography process to form at least a pixel electrode. The pixel electrode is electrically connected to the drain 15b through a via hole in the protective layer 16.

In this way, the method for manufacturing the array substrate 100 according to the embodiment of the present disclosure is completed.

In the method for manufacturing the array substrate 100 in the embodiment of the present disclosure, the second metal thin film layer 152 is formed on a side of the first metal thin film layer 151 away from the semiconductor layer 14, and in the etching process which is performed on the second metal structural layer 15 with the electrolyte solution, the first metal thin film layer 151, the second metal thin film layer 152, and the electrolyte solution form the primary cell. The second metal thin film layer 152 is used as the anode of the primary cell, thereby reducing the corrosion rate of the first metal thin film layer 151, reducing the loss of the first metal thin film layer 151 on a channel side between the source 15a and the drain 15b, and meeting the application requirements of the narrow channel of the thin film transistor.

Figure 5:
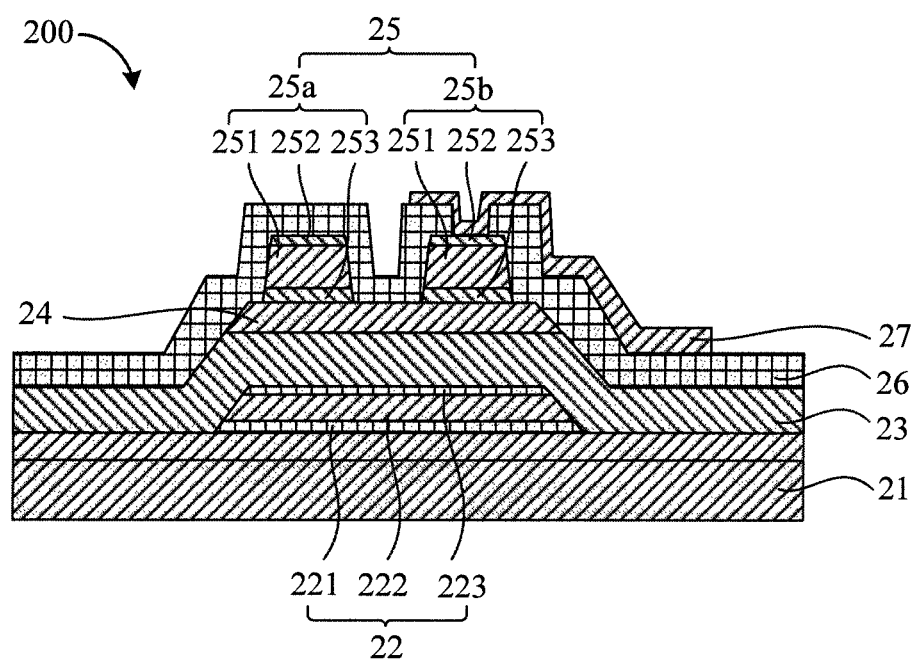
FIG. 5 is a schematic structural diagram of an array substrate provided by an embodiment of the present disclosure.

Refer to FIG. 5, which is a schematic structural diagram of the thin film transistor 200 according to an embodiment of the present disclosure.

An embodiment of the present disclosure provides a thin film transistor 200 including a substrate 21, a first metal structure layer 22, an insulating layer 23, a semiconductor layer 24, a second metal structure layer 25, a protective layer 26, and a pixel electrode layer 27. A buffer layer (not shown) is further included between the first metal structure layer 22 and the substrate 21.

Specifically, the first metal structure layer 22 is disposed on the substrate 21. The first metal structure layer 22 includes a fourth metal thin film layer 221, a fifth metal thin film layer 222, and a sixth metal thin film layer 223 sequentially disposed.

The insulating layer 23 is disposed on the substrate 21 and covers the first metal structure layer 22. The semiconductor layer 24 is disclosed on the insulating layer 23. The second metal structure layer 25 is disposed on the semiconductor, layer 24.

Specifically, the second metal structure layer 25 includes a first metal thin film layer 251, a second metal thin film layer 252, and a third metal thin film layer 253 sequentially disposed. A thickness of the third metal thin film layer 253 is smaller than a thickness of the first metal thin film layer 251.

When the second metal structure layer 25 is patterned by using the electrolyte solution, the corrosion rate of the second metal thin film layer 252 in the etching solution is greater than the corrosion rate of the first metal thin film layer 251 and the third metal thin film layer 253. By determining the thickness of the third metal thin film layer 253 to be smaller than the thickness of the first metal thin film layer 251, the corrosion rate of the third metal thin film layer 253 is lower than the corrosion rate of the first metal thin film layer 251, thereby reducing the probability that the second metal thin film layer 252 is recessed inward, further reducing the risk of disconnection of the second metal structure layer 25 used as metal wires, and improving the conductive performance of the thin film transistor.

Furthermore, the patterned second metal structure layer 25 includes a source 25a and a drain 25b, and a channel is formed between the source 25a and the drain 25b (not shown).

The protective layer 26 is disposed on the substrate 21 and covers the second metal structure layer 25. Specifically, the protective layer 26 is disposed on the insulating layer 23 and covers the semiconductor layer 24, the source 25a, and the drain 25b. The protective layer 26 is provided with a via hole (not labeled) for exposing the drain 25b.

The pixel electrode layer 27 is disposed on the protective layer 26. The pixel electrode layer 27 includes a pixel electrode, and the pixel electrode is electrically connected to the drain 25 b through the via hole in the protective layer 26.

In addition, the method for manufacturing the array substrate of the embodiment is consistent with the method for manufacturing the array substrate of the above embodiment. For details, refer to the method for manufacturing the array substrate of the above embodiment.

Compared with the conventional method for manufacturing an array substrate, in the method for manufacturing the array substrate in the present disclosure, the second metal thin film layer is formed on a side of the first metal thin film layer away from the semiconductor layer, and in the etching process which is performed on the second metal structural layer with the electrolyte solution, the first metal thin film layer, the second metal thin film layer, and the electrolyte solution form the primary cell. The second metal thin film layer is used as the anode of the primary cell, thereby reducing the corrosion rate of the first metal thin film layer, thereby meeting the application requirements of the narrow channel of the thin film transistor.

The foregoing provides a detailed description of the embodiment of the present disclosure. The principles and the implementations of the present disclosure are described in the specific examples. The description of the above embodiments is only used to facilitate understanding the present disclosure. Moreover, for those skilled in the art, based upon the idea of the present disclosure, there may be modifications in the specific implementations and the scopes of the present disclosure. In summary, the content of this description should not be considered as a limitation of the present disclosure.

What is claimed is:

1. A method for manufacturing an array substrate, comprising steps of:
   providing a substrate;
   forming a patterned first metal structure layer on the substrate;
   forming an insulating layer on the substrate;
   forming a semiconductor layer on the substrate;
   forming a second metal structure layer on the semiconductor layer, wherein the second metal structure layer includes a third metal thin film layer, a first metal thin film layer and a second metal thin film layer sequentially formed on the semiconductor layer, wherein the first metal thin film layer is formed after the third metal thin film layer, the second metal thin film layer is formed after the first metal thin film layer, and the first metal thin film layer is formed between the semiconductor layer and the second metal thin film layer, and wherein the second metal thin film layer, and the third metal thin film layer each consists of one or a combination of molybdenum, titanium and nickel, wherein a thickness of the second metal thin film layer is smaller than a thickness of the third metal thin film layer; and
   etching the second metal structure layer with an electrolyte solution to form a patterned second metal structure layer, wherein the patterned second metal structure layer includes a source and a drain, the third metal thin film layer, the first metal thin film layer, the second metal thin film layer, and the electrolyte solution form a primary cell, the second metal thin film layer and the third metal thin film layer are each an anode, the first metal thin film layer is a cathode, and the electrolyte solution is a hydrogen peroxide-based etching solution.

2. The method for manufacturing the array substrate as claimed in claim 1, wherein the step of forming the second metal structure layer on the semiconductor layer comprises a step of:
   sequentially forming the third metal thin film layer, the first metal thin film layer, and the second metal thin film layer on the semiconductor layer, by using a sputtering process, to form the second metal structure layer.

3. The method for manufacturing the array substrate according to claim 2, wherein etching the second metal structure layer with the electrolyte solution to form the patterned second metal structure layer comprises steps of:
   forming a photoresist layer on the second metal structure layer;
   patterning the photoresist layer with a photomask to at least form a first portion corresponding to a source deployment region and a drain deployment region of the second metal structure layer, and a second portion corresponding to a channel deployment region between the source deployment region and the drain deployment region, wherein a thickness of the first portion is greater than a thickness of the second portion;
   etching the second metal structure layer with the electrolyte solution, by using the patterned photoresist layer as a mask, to form a preliminary patterned second metal structure layer;
   ashing the patterned photoresist layer, thinning the first portion, removing the second portion, and exposing the channel deployment region of the second metal structure layer;
   etching the preliminary patterned second metal structure layer with the electrolyte solution to at least form the source, the drain, and the channel between the source and the drain;
   wherein in the step of etching the preliminary patterned second metal structure layer with the electrolyte solution, the first metal thin film layer, the second metal thin film layer, and the electrolyte solution form a primary cell, and the second metal thin film layer is an anode; and
   removing the photoresist layer.

4. The method for manufacturing the array substrate as claimed in claim 1, wherein the step of forming the patterned first metal structure layer on the substrate comprises steps:
   sequentially forming a fourth metal thin film layer, a fifth metal thin film layer, and a sixth metal thin film layer on the substrate to form the first metal structure layer; and
   etching the first metal structure layer with the electrolyte solution to form the patterned first metal structure layer, wherein the fourth metal thin film layer, the fifth metal thin film layer, and the electrolyte solution form a primary cell, the fourth metal thin film layer is an anode, the fifth metal thin film layer, the sixth metal thin film layer, and the electrolyte solution form a primary cell, and the sixth metal thin film layer is an anode.

5. The method for manufacturing the array substrate as claimed in claim 1, wherein material of the first metal thin film layer is copper.

6. A method for manufacturing an array substrate, comprising steps of: providing a substrate;
   forming a patterned first metal structure layer on the substrate;
   forming an insulating layer on the substrate; forming a semiconductor layer on the substrate;
   forming a second metal structure layer on the semiconductor layer, wherein the second metal structure layer includes a third metal thin film layer, a first metal thin film layer and a second metal thin film layer sequentially formed on the semiconductor layer, wherein the first metal thin film layer is formed after the third metal thin film layer, the second metal thin film layer is formed after the first metal thin film layer, and the first metal thin film layer is formed between the semiconductor layer and the second metal thin film layer, and wherein the second metal thin film layer and the third metal thin film layer each consists of a combination of molybdenum and titanium; and
   etching the second metal structure layer with an electrolyte solution to form a patterned second metal structure layer, wherein the patterned second metal structure layer includes a source and a drain; the third metal thin film layer, the first metal thin film layer, the second metal thin film layer, and the electrolyte solution form a primary cell, and the second metal thin film layer and the third metal thin film layer are each an anode, and the first metal thin film layer is a cathode.

7. The method for manufacturing the array substrate as claimed in claim 6, wherein the step of forming the second metal structure layer on the semiconductor layer comprises a step of:
sequentially forming the third metal thin film layer, the first metal thin film layer, and the second metal thin film layer on the semiconductor layer, by using a sputtering process, to form the second metal structure layer.

8. The method for manufacturing the array substrate according to claim 7, wherein etching the second metal structure layer with the electrolyte solution to form the patterned second metal structure layer comprises steps of:
forming a photoresist layer on the second metal structure layer;
patterning the photoresist layer with a photomask to at least form a first portion corresponding to a source deployment region and a drain deployment region of the second metal structure layer, and a second portion corresponding to a channel deployment region between the source deployment region and the drain deployment region, wherein a thickness of the first portion is greater than a thickness of the second portion;
etching the second metal structure layer with the electrolyte solution, by using the patterned photoresist layer as a mask, to form a preliminary patterned second metal structure layer;
ashing the patterned photoresist layer, thinning the first portion, removing the second portion, and exposing the channel deployment region of the second metal structure layer;
etching the preliminary patterned second metal structure layer with the electrolyte solution to at least form the source, the drain, and the channel between the source and the drain;
wherein in the step of etching the preliminary patterned second metal structure layer with the electrolyte solution, the first metal thin film layer, the second metal thin film layer, and the electrolyte solution form a primary cell, and the second metal thin film layer is an anode; and
removing the photoresist layer.

9. The method for manufacturing the array substrate according to claim 6, after the step of etching the second metal structure layer with the electrolyte solution, further comprising a step of etching the semiconductor layer with the electrolyte solution to form a patterned semiconductor layer.

10. The method for manufacturing the array substrate as claimed in claim 6, wherein the step of forming the patterned first metal structure layer on the substrate comprises steps:
sequentially forming a fourth metal thin film layer, a fifth metal thin film layer, and a sixth metal thin film layer on the substrate to form the first metal structure layer; and
etching the first metal structure layer with the electrolyte solution to form the patterned first metal structure layer, wherein the fourth metal thin film layer, the fifth metal thin film layer, and the electrolyte solution form a primary cell, the fourth metal thin film layer is an anode, the fifth metal thin film layer, the sixth metal thin film layer, and the electrolyte solution form a primary cell, and the sixth metal thin film layer is an anode.

11. The method for manufacturing the array substrate as claimed in claim 6, after the step of forming the patterned second metal structure layer, further comprising steps of:
forming a patterned protective layer on the substrate, wherein the protective layer covers the second metal structure layer; and
forming a patterned pixel electrode layer on the protective layer, wherein the pixel electrode layer is electrically connected to the drain.

12. The method for manufacturing the array substrate as claimed in claim 6, wherein material of the first metal thin film layer is copper.

* * * * *